United States Patent
Ku et al.

(10) Patent No.: US 6,171,764 B1
(45) Date of Patent: Jan. 9, 2001

(54) METHOD FOR REDUCING INTENSITY OF REFLECTED RAYS ENCOUNTERED DURING PROCESS OF PHOTOLITHOGRAPHY

(76) Inventors: Chia-Lin Ku, 7F, No. 83, Chen-Cheng II Rd., Chu-Pei City, Hsin-Chu County (TW); Wen-Ping Yen, No. 43-2, Kuang-Hua East Road, Hsinchu City (TW)

(*) Notice: Under 35 U.S.C. 154(b), the term of this patent shall be extended for 0 days.

(21) Appl. No.: 09/138,233

(22) Filed: Aug. 22, 1998

(51) Int. Cl.[7] .................................................. G03C 5/00
(52) U.S. Cl. .................................. 430/322; 430/313
(58) Field of Search ........................ 430/311, 313, 430/322, 950; 427/452, 578

(56) References Cited

U.S. PATENT DOCUMENTS

| | | | |
|---|---|---|---|
| 5,472,829 | * 12/1995 | Ogawa | 430/950 |
| 5,600,165 | * 2/1997 | Tsukamoto et al. | 257/323 |
| 5,741,626 | * 4/1998 | Jain et al. | 430/311 |
| 5,858,870 | * 1/1999 | Zheng et al. | 438/622 |
| 5,963,841 | * 10/1999 | Karlsson et al. | 438/952 |

* cited by examiner

Primary Examiner—S. Rosasco
(74) Attorney, Agent, or Firm—W. Wayne Liauh

(57) ABSTRACT

This invention provides methods for reducing the intensity of reflected rays encountered during the process of photolithography. By reducing the intensity of reflected ray, the pattern distortions associated with the interference from secondary rays can be minimized. In addition, this method for reducing the intensity of reflected ray can also eliminate the footing effect of other known methods in which the dielectric ARC layer is first deposited on the underlying layer, followed by the subsequent photolithography process of coating exposing, and developing.

8 Claims, 4 Drawing Sheets

METHOD FOR REDUCING INTENSITY OF REFLECTED RAYS ENCOUNTERED DURING PROCESS OF PHOTOLITHOGRAPHY

BACKGROUND OF THE INVENTION

1. Field of the Invention

This invention relates generally to methods for reducing the intensity of reflected rays experienced during the exposure process in semiconductor manufacturing. More particularly, the invention relates to methods of utilizing a dielectric anti-reflective coating (DARC) layer to effectively control the intensity of reflected rays encountered during the photolithography process.

2. Background of the Invention

During the exposure process in photolithography, rays that penetrate the photo mask will be transmitted through the surface of the underlying layer and will be reflected by the substrate. These reflected rays will then expose portions of the photoresist that were supposed to be blocked by the mask during the initial exposure. In other words, the reflected rays will result in unwanted exposure in portions of the photoresist causing chemical reactions in the photoresist and the subsequent removal of the photoresist when developed (unwanted photoresist removal will occur for positive photoresist, and vice versa for negative photoresist). The resulting pattern distortion during the exposure process, due to the reflected rays, is referred to as the reflected ray effect.

With the continual shrinkage of line width in semiconductor processing, the proportion of pattern distortion in relation to the overall line width is increasing and will severely effect yield and reliability, causing unwanted shorts and a deterioration in CD (critical dimension) control. To overcome this problem, anti-reflective layer, such as the TiN (titanium nitride) in metal layers, is commonly used to control the intensity of reflected rays.

In more sophisticated technology, it is common practice to use a DARC layer to reduce the amount of reflected rays from non-metalic layers. Due to its ability to absorb rays and to produce a phase shift in the reflected rays, the DARC layer is extensively used in 0.25 $\mu$m technology to inhibit the effects of non-metal layer reflection in the photolithography process.

Referring to FIG. 1, the utilization of a DARC layer in the photolithography process is illustrated. It includes a substrate 10, an underlying layer 11 that do not have physical contact with the photoresist, but need to be patterned, and a hard mask layer 12 namely $SiO_2$ that serves as an indirect photo mask. In the situation in which the photoresist cannot have physical contact with the underlying layer, and in which the underlying layer needs to be defined, a $SiO_2$ layer would first be deposited as the hard mask 12. The pattern on the photoresist will first be transferred onto the hard mask and the defined hard mask will then be used as an indirect mask to define the underlying layer 11.

Above the hard mask layer 12 are a DARC layer 13 and a photoresist 14. During exposure, the DUV ray 20 enters from the top. Its first reflected ray 21 is the reflection from the DARC layer 13; the second reflected ray 22 is the reflection from the substrate 10, which has already undergone the absorption and the phases shifting when penetrating the DARC layer 13. Hence, when the second reflected ray 22 penetrates the DARC layer 13 and combines with the first reflected ray 21, the phase shifting cancellation occurs between both reflected rays 21 and 22, thereby reducing the intensity of reflected rays.

Theoretically, when a ray penetrates a multi-layer structure, it will produce a reflected ray and a transmitted ray at each interface as shown in FIG. 1. Hence, in theory, there would be a third reflected ray 23 and a fourth reflected ray 24 besides the reflected rays 21 and 22. However, since the DUV ray can easily penetrate the various layers shown in FIG. 1, the third reflected ray and the fourth reflected ray 24 can be combined with the second reflected ray 22.

Nonetheless, the method of suppressing reflected rays during the photolithography process as mentioned above has the following problems:

1) If the hard mask film thickness is non-uniform, it will produce non-uniform reflections. It is not possible to suppress this kind of non-uniform reflections by traditional methods.

2) The DUV active photoresist on the DARC layer will undergo chemical reaction when it has the physical contact with the DARC layer producing a thin amino group ($NH_2$) film. This will result in the footing effect with the subsequent patterning of the photoresist.

3) During the formation of the DARC layer, the subsequent rapid thermal processing associated with the plasma enhanced chemical vapor deposition (PECVD) process will cause the hard mask layer to undergo physical change as a result of ionic and thermal stress, affecting the etching process of the hard mask that follows.

4) With the DARC layer being on top of the hard mask, the pattern definition process requires the removal of the DARC and hard mask layers. During the etching process of the hard mask layer, the sidewall is easily etched away, forming a bowing profile.

SUMMARY OF THE INVENTION

The object of the present invention is to provide a method of suppressing reflected rays in the photolithography process in order to avoid the problems associated with the unwanted reflection.

The anti-reflection process of the present invention involves the formation of an underlying layer to be patterned on a wafer substrate, followed by the deposition of a DARC layer, a hard mask layer, and photoresist. The exposure is then performed to transfer the pattern. The difference between this invention and other known methods rests in that the DARC layer lies beneath the hard mask layer, and not vice versa.

In addition, it is also possible to deposit a DARC layer both above and beneath the hard mask layer, forming a "sandwich" structure. The process involves the formation of an underlying layer on the substrate, followed by the deposition of a DARC layer, a hard mask layer, and a $2^{nd}$ DARC layer. Finally, the photoresist is coated and the pattern is defined through the exposure.

Other objects, features, and advantages of the invention will become apparent from the following detailed description of the preferred but non-limiting embodiments. The description is made with reference to the accompanying drawings.

DETAILED DESCRIPTION OF THE FIGURES

Figure 2:
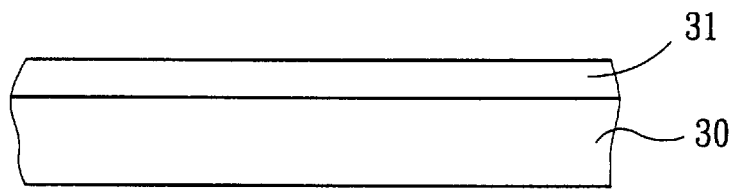
FIG. 2 to FIG. 5 illustrate the process flow of the first of the invention in which the reflected rays can be controlled.

Referring to FIG. 2 to FIG. 5, the first embodiment of the invention is illustrated, comprising the four following steps:

Step 1: As shown in FIG. 2, an underlying layer 31 is deposited on the substrate 30. This underlying layer can be a single layer or a multi-layer Si-based material, for example $SiO_2$ or $SiN_2$.

Figure 3:
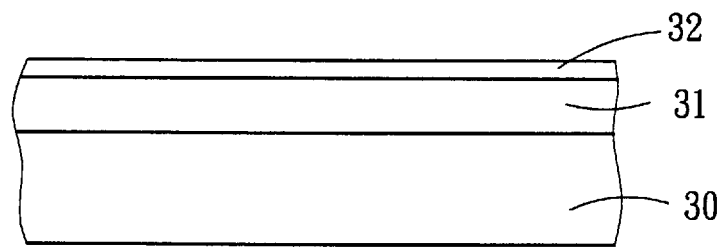

Step 2: As shown in FIG. 3, a DARC layer 32 is deposited on the underlying layer 31 and formed by the PECVD process using $SiH_4$ and $N_2O$ as the reactant. The DARC layer is a composed of $Si_xO_yN_z$ material. The quantity of the material composition (x,y,z) can be modified during the PECVD process by adjusting the flow rate of the reacting gases and process time to achieve a DARC layer 32 composition that would result in the maximum reflection reduction with the optical interference on the incoming ray as it penetrates the DARC layer 32. The deposition process described in the invention will have varying process parameters that depend on the type of entity used. For example, when the $SiH_4$ to $N_2O$ gas flow rate (Standard Cubic Centimeter per Minute, SCCM) ratio is 3:5, the temperature is between 350~550° C., the pressure is between 5.5~20 torr, the deposited thickness is between 300~500 Å or 700~900 Å; the reflection reduction capability of the invention can be achieved under these conditions. However, based on the idea of this invention, any personnel skilled in the PECVD process can also create a different set of process parameters that is not bound by the above mentioned set of process parameters.

Figure 4:
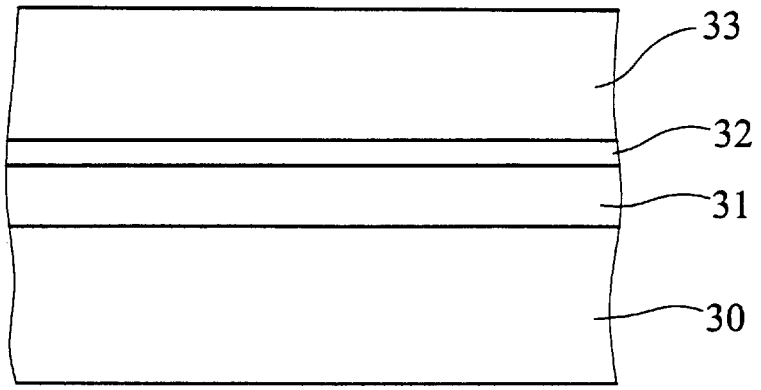

Step 3: As shown in FIG. 4, the hard mask layer 33 is deposited on the DARC layer 32. The hard mask material can be $SiO_2$, $SiN_x$ or BPSG (Borophosphosilicate Glass), deposited via CVD process.

Figure 5:
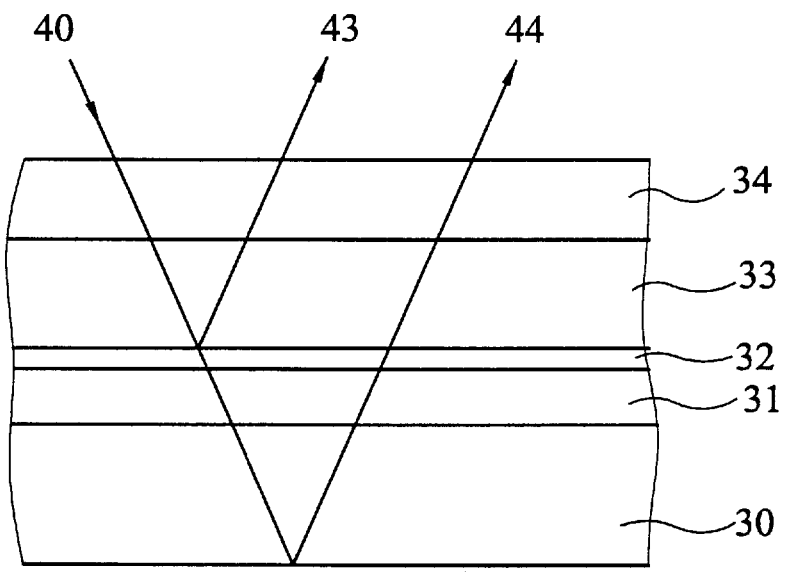

Step 4: As shown in FIG. 5, the photoresist 34 is coated on the hard mask layer 33.

Steps 2 and 3 of the process described above are the key-points of the current embodiment. As mentioned earlier, since the DUV ray can easily penetrate the hard mask layer 33, it can be presumed that the pattern distortion is mainly caused by the rays reflected from the substrate 30.

As shown in FIG. 5, the entrance of the incident ray 40 will produce a third reflected ray 43 and a fourth reflected ray 44. Similarly, the DARC layer will cause the fourth reflected ray to undergo the absorption and phase shifting, resulting in the phase shift cancellation when the fourth reflected ray combines with the third reflected ray. In this embodiment, the intensity of the reflected ray will be reduced to less than 10% that of the incident rays.

Figure 1:
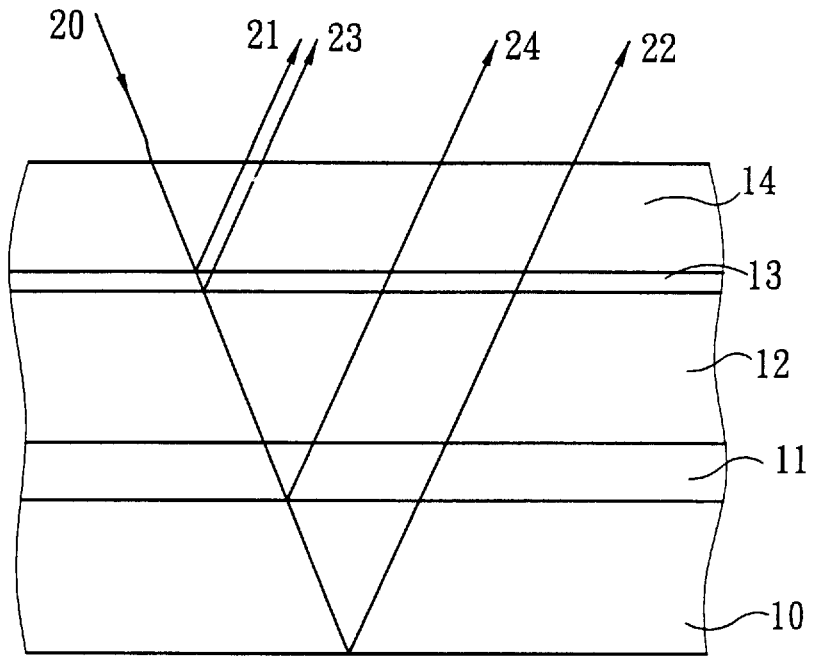
FIG. 1 is a structural cross section diagram of a known process used to reduce the reflected ray effect.
Figure 6:
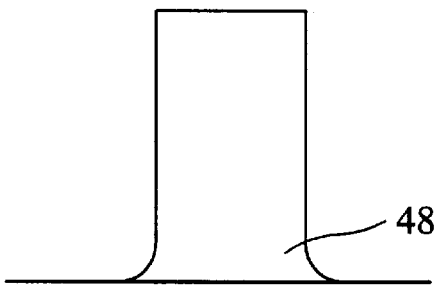
FIG. 6 illustrates the etching profile resulted from the footing effect characteristic in other known methods.

In addition, the current embodiment can also overcome a shortcoming that is present in other known methods. Referring to the known method shown in FIG. 1, the DARC layer 13, being formed above the hard mask layer 12, will come into contact with the photoresist. The resulting problems are:

1) The DUV sensitive photoresist will undergo chemical reaction when it comes into physical contact with the DARC layer, forming amino groups that will alter the characteristics of the photoresist and produce residues that cannot be removed by the subsequent developing processes. These residues are shown as the foot like structure 48 in FIG. 6, and this phenomenon is termed the footing effect.

2) During the deposition process of the DARC layer, a high temperature plasma environment will alter the characteristic of the hard mask layer. This results in a reduction in the etching rate of the hard mask layer, thereby reducing the productivity. The future etching of the hard mask layer will also be affected.

Figure 7:
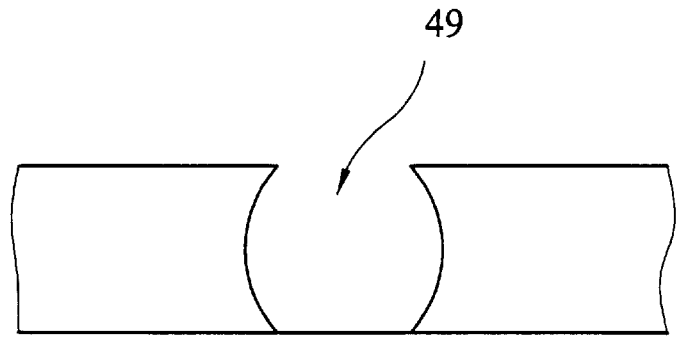
FIG. 7 illustrates the bowing profile resulted from the utilization of a hard mask layer characteristic in other known methods.

3) With the DARC layer being deposited on the hard mask layer, it is necessary to etch away the DARC layer first when the pattern is transferred to the hard mask layer, complicating the process. It is also very easy to produce the bowing effect 49 as shown in FIG. 7 when separately removing the DARC and hard mask layers.

Since the DARC layer 32 is deposited before the hard mask layer 33 in this embodiment, the film characteristics of the hard mask layer 33 will not be affected by high temperature and plasma. In addition, since the DARC layer 32 is below the hard mask layer, the photoresist 34 will not come into physical contact with the DARC layer. Hence, the footing effect will not be presented. Finally, it is also not necessary to etch away the DARC layer 32 first when etching the hard mask layer 33, thereby simplifying the process.

Figure 8:
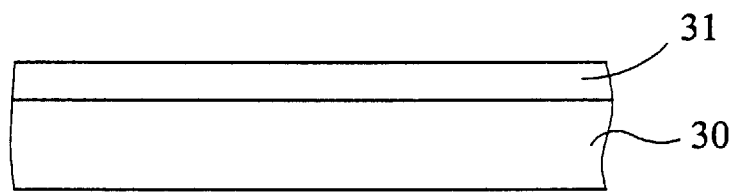
FIG. 8 to FIG. 12 show the process flow of the second embodiment of the invention in which reflected rays can be controlled.

Based on the process described above, a $2^{nd}$ DARC layer can be deposited on the hard mask layer when solving the non-uniform reflection problem associated with non-uniform hard mask thickness. The process flow is described below:

Step 1: As shown in FIG. 8, an underlying layer 31 (single or multi-layer structure) is formed on the substrate 30. This underlying layer is formed by Si-based material such as $SiO_2$ or $SiN_x$.

Figure 9:
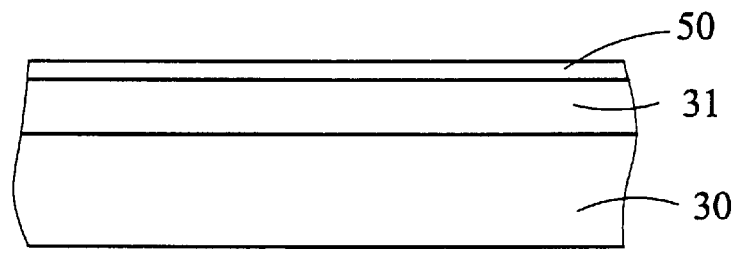
Figure 10:
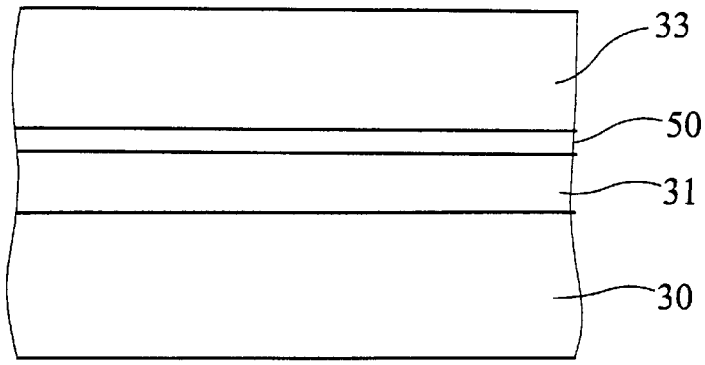

Step 2: As shown in FIG. 9, a DARC layer 50 is deposited on the underlying layer 31 and formed by the PECVD process using the $SiH_4$ and $N_2O$ as the reactants. The DARC layer is composed of $Si_xO_yN_z$ material. The quantity of the material composition (x,y,z) can be modified during the PECVD process by adjusting the flow rate of the reacting gases and process time to achieve a DARC layer 50 composition that would result in the maximum reflection reduction with the optical interference on the incoming ray as it penetrates the DARC layer 50. The deposition process described in the invention will have varying process parameters that depend on the type of the entity used. For example, when the $SiH_4$ to $N_2O$ gas flow rate (SCCM) ratio is 3:5, the temperature is between 350~550° C., the pressure is between 5.5~20 torr, the deposited thickness is 300~500 Å or 700~900 Å;

Step 3: As shown in FIG. 10, the hard mask layer 33 is deposited on the DARC layer 50. The hard mask material can be SiO2, $SiN_x$ or BPSG, deposited via a CVD process.

Figure 11:
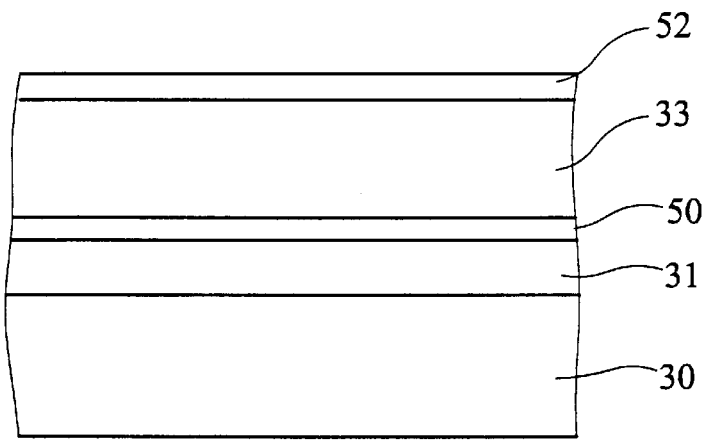

Step 4: As shown in FIG. 11, a $2^{nd}$ DARC layer 52 is deposited on the hard mask layer 33. The material is $Si_xO_yN_z$ and the film thickness is less than 1000 Å.

Figure 12:
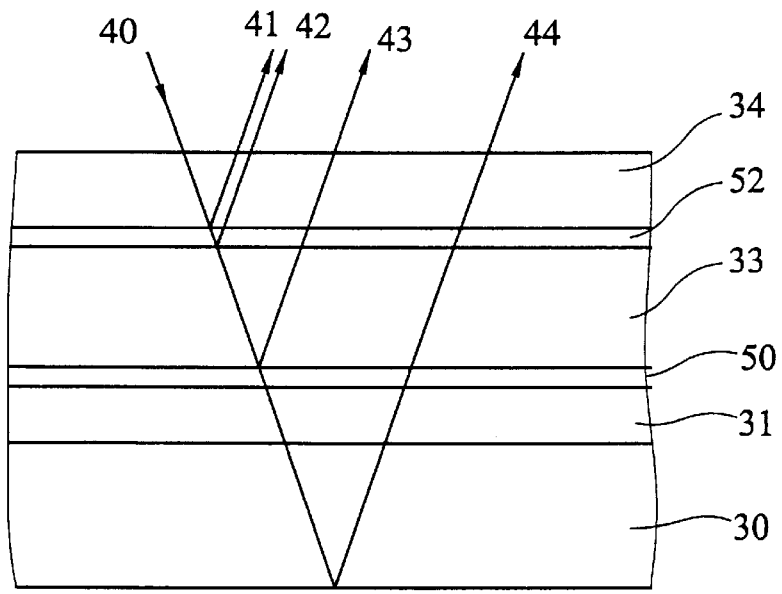

Step 5: As shown in FIG. 12, photoresist 34 is coated on the wafer surface.

The unique part of this embodiment lies in the step 4. The structure includes two DARC layers, forming a "sandwich" structure. As shown in FIG. 12, the reflected rays produced by the incident ray 40 will combine at the first DARC layer 50, and will experience the phase shift cancellation when combined with the third and fourth reflected rays. The resulting reflected ray will undergo further the phase shift cancellation when combined with the first and second reflected rays produced by the $2^{nd}$ DARC layer. The reflected rays can be greatly reduced as a result of the absorption and phase shifting by the two DARC layers. The intensity of the reflected rays can be reduced to less than 10% of that of the incident rays.

The present embodiment is more capable for solving the shortcoming of other known methods. It is known that if the hard mask layer is non-uniform, it will produce non-uniform reflection. However, since there are two DARC layers 50 and 52 in this embodiment, the effect of the non-uniform reflected ray will be reduced after penetrating the first DARC layer. Hence, it is possible to reduce the non-uniform reflection caused by a non-uniform hard mask 33 film thickness.

This invention provides two embodiments in which DARC layer can be utilized to suppress reflection during the photolithography process. Although the embodiments utilize a hard mask layer and an underlying structure, it is understood that the invention can be easily implemented by using different types of DARC layer, and is not restricted by the exposed structure. Hence, any utilization involving the claims herein described in this invention, regardless of a change in the number, the stack structure, and the composition of the film layers will be treated as an infringement on the right of this invention.

What is claimed is:

1. A method for reducing reflection caused by patterning a hard mask layer during a photolithography process through the use of a dielectric anti-reflective coating (DARC) layer, comprising the steps of:

forming a dielectric underlying layer on a substrate;

forming a first DARC layer on the dielectric underlying layer;

forming a hard mask directly on the first DARC layer;

coating a photoresist layer on the hard mask; and proceeding with a subsequent photolithography process, wherein the hard mask serves as an indirect mask for defining the dielectric underlying layer that has been formed below the first DARC layer and the hard mask.

2. The method for reducing the reflection caused by patterning a hard mask layer through the use of a DARC layer recited in claim 1, wherein the first DARC layer includes $Si_xO_yN_z$.

3. The method for reducing the reflection caused by patterning a hard mask layer through the use of a DARC layer recited in claim 2, wherein the first DARC layer is formed at a ratio of gas flow rate of $SiH_4$ to $N_2O$ of 3:5, a temperature of 350 to 550° C., a pressure of 5.5 torr to 20 torr, and a deposited film thickness of 300 to 500 Å.

4. The method for reducing the reflection caused by patterning a hard mask layer through the use of a DARC layer recited in claim 2, wherein the first DARC layer is formed at a ratio of gas flow rate of $SiH_4$ to $N_2O$ of 3:5, a temperature of 350 to 550° C., a pressure of 5.5 torr to 20 torr, and a deposited film thickness of 700 to 900 Å.

5. The method for reducing the reflection caused by patterning a hard mask layer through the use of a DARC layer recited in claim 1 which further comprises the step of forming a second DARC layer on the hard mask layer.

6. The method for reducing the reflection caused by patterning a hard mask layer through the use of a DARC layer recited in claim 5, wherein the second DARC layer includes $Si_xO_yN_z$.

7. The method for reducing the reflection caused by patterning a hard mask layer through the use of a DARC layer recited in claim 5, wherein the second DARC layer is formed at a ratio of gas flow rate of $SiH_4$ to $N_2O$ of 3:5, a temperature of 350 to 550° C., a pressure of 5.5 torr to 20 torr, and a deposited film thickness of 300 to 1000 Å.

8. The method for reducing the reflection caused by patterning a hard mask layer through the use of a DARC layer recited in claim 5, wherein the dielectric underlying layer is a silicon-based dielectric layer which also contains oxygen or nitrogen atoms.

* * * * *